United States Patent
Breece, III et al.

(10) Patent No.: US 9,847,713 B2
(45) Date of Patent: Dec. 19, 2017

(54) CHARGE PUMP-BASED SPLIT-RAIL SUPPLY GENERATION

(71) Applicant: Apple Inc., Cupertino, CA (US)

(72) Inventors: David C. Breece, III, Palo Alto, CA (US); Roderick B. Hogan, San Francisco, CA (US); Nathan A. Johanningsmeier, San Jose, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/070,508

(22) Filed: Mar. 15, 2016

(65) Prior Publication Data
US 2017/0271983 A1  Sep. 21, 2017

(51) Int. Cl.
*H03F 1/00* (2006.01)
*H02M 3/07* (2006.01)
*H03F 3/183* (2006.01)
*H03F 3/19* (2006.01)

(52) U.S. Cl.
CPC .............. *H02M 3/07* (2013.01); *H03F 3/183* (2013.01); *H03F 3/19* (2013.01); *H02M 2003/071* (2013.01); *H03F 2200/03* (2013.01)

(58) Field of Classification Search
CPC ....................................................... H03F 3/195
USPC ........................................ 330/136, 296, 297
See application file for complete search history.

(56) References Cited

U.S. PATENT DOCUMENTS

| | | | |
|---|---|---|---|
| 6,636,103 B2 * | 10/2003 | Wurcer | H03F 1/0222 327/390 |
| 7,034,602 B2 | 4/2006 | Meek et al. | |
| 7,990,742 B2 | 8/2011 | Lesso | |
| 9,065,392 B2 | 6/2015 | Myles | |
| 9,136,755 B2 | 9/2015 | Lesso et al. | |
| 2007/0279021 A1 | 12/2007 | Yanagida et al. | |

OTHER PUBLICATIONS

Khoo, et al., "Analysis of a Charge Pump Power Supply with a Floating Voltage Reference", *IEEE Transactions on Circuits and Systems*, (Oct. 2000).

* cited by examiner

*Primary Examiner* — Khanh V Nguyen
*Assistant Examiner* — Khiem Nguyen
(74) *Attorney, Agent, or Firm* — Blakely Sokoloff Taylor & Zafman LLP

(57) ABSTRACT

A charge pump circuit having first and second input nodes to be coupled to a first power source, and top and bottom output nodes and an intermediate node. The charge pump circuit produces i) a voltage at the top output node that is higher than a voltage of the intermediate node, and ii) a voltage at the bottom output node that is lower than the voltage of the intermediate node. A bias voltage source has i) an input that is to be coupled to a second power source and ii) an output that produces an output voltage, which is a predetermined proportion of an input voltage at the input and that follows the input voltage downward and upward as the input voltage sags and recovers, respectively. The output of the bias voltage source is directly connected to the intermediate node of the output stage. Other embodiments are also described.

20 Claims, 10 Drawing Sheets

1. NORMAL OPERATION NOMINAL LEVELS
2. HIGH ENERGY TRANSIENT CAUSES POWER SOURCE VOLTAGE Vin2 TO SAG
3. RECOVERY IN Vin2
4. BACK TO NOMINAL LEVELS

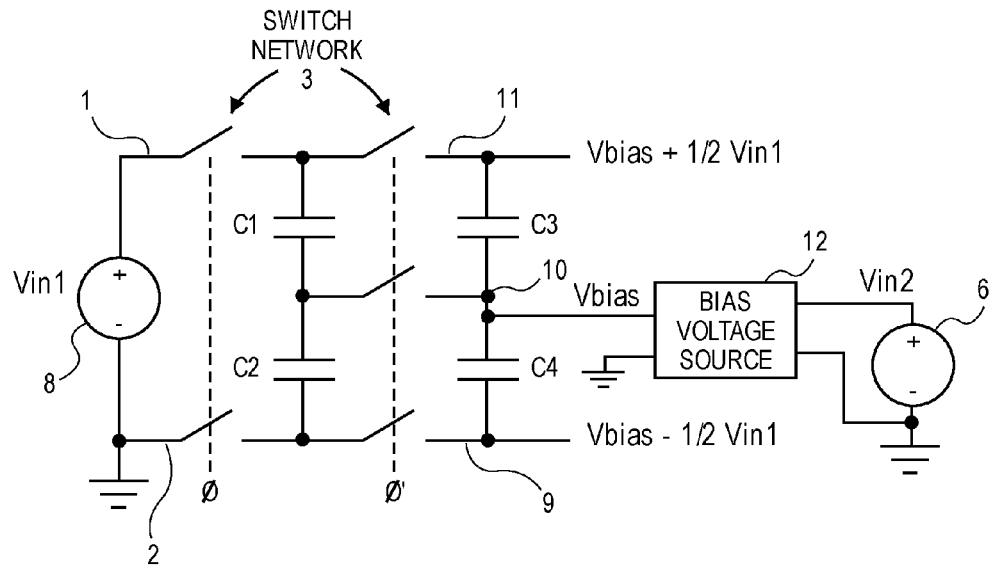
FIG. 3
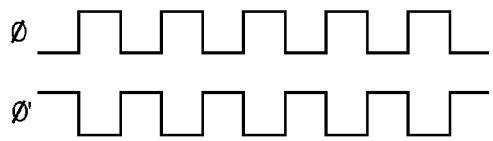
FIG. 4
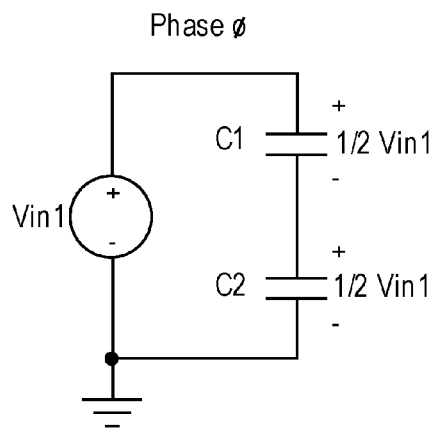
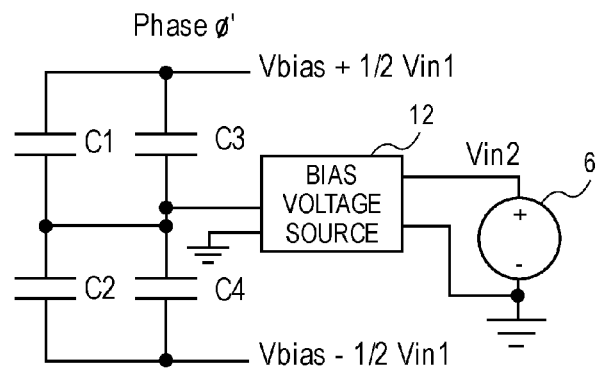
FIG. 5     FIG. 6

CHARGE PUMP-BASED SPLIT-RAIL SUPPLY GENERATION

FIELD

An embodiment of the invention generally relates to electronic circuit techniques for generating positive and negative dc power supply voltages (or a dual power supply), from a first input dc voltage, using a charge pump circuit, and more particularly to a power supply whose dual outputs are shifted to be above and below, respectively, the midpoint of a second input voltage. Other embodiments are also described.

BACKGROUND

A split rail power supply (also referred to here as a dual, dc power supply) is needed to supply power to a signal controller for a Class D audio power amplifier, e.g., +5 Vdc, −5 Vdc. The controller produces the audio signals that are needed to drive the power stage transistors (of the power amplifier). The audio signals are typically centered about ground (zero Volts), but available power sources in many applications typically only provide a single, positive voltage relative to ground, e.g., a battery, or the output of an AC-DC wall power adapter. A power conversion circuit may be used in such cases, referred to as a split rail power supply, that converts the single, positive input voltage of the power source into positive and negative dc output voltages, or top and bottom rail voltages. The top and bottom rail voltages are produced relative to an output ground node that is at a different potential than the ground node of the power source.

SUMMARY

In some cases, the power supply voltage provided by a power source to a load, such as an audio power amplifier, sags and then recovers during operation, due to strong changes in the load that is on the power source. It is desirable in that case to maintain symmetrical headroom for the load that is being powered by the power source. For instance, this headroom may be defined in part by the available output signal swing of a signal controller that is driving the audio power amplifier, where the latter is being powered directly by the power source. To explain, consider the example of a power source whose output is 40 Vdc nominal, relative to its ground, and a split rail power supply (that is supplying power to the signal controller) whose output ground is nominally at the middle of the power source voltage, e.g., 20 Vdc. Let the output rails of the split rail supply be at 25 Vdc and 15 Vdc, just as an example. If the power source sags from 40 Vdc to 35 Vdc, then in a typical solution in which the output rails of the split rail supply remain regulated at 25 Vdc and 15 Vdc, respectively, the headroom available to the audio power amplifier that is being powered by the power source becomes asymmetrical. That is, the separation between the upper output rail, which remains at 25 Vdc, and the power source, is now 10 Vdc, which is smaller (in this case by 5 Volts) than the separation between the lower output rail, which remains at 15 Vdc, and the input ground.

A solution to the asymmetrical headroom problem is to design a split rail power supply circuit, that may be powered by a first input voltage, so that its output ground node follows or tracks a second input voltage (which in one case is the power source voltage for the audio power amplifier or other load), as the second input voltage sags and recovers. Thus, taking the example above, a +/−5 Vdc dual output from such an improved power supply will maintain a 10 Vdc separation between its output rails as these "float" down and up responsive to the second input voltage sagging and recovering, respectively. In other words, the output rail voltages stay at +5 Vdc above and −5 Vdc below the output ground, while the output ground changes by following the sagging and recovering second input voltage. Viewed another way, the split rail power supply output voltages may remain fixed relative to each other, or their separation remains fixed, but they "float" in accordance with the second input voltage. In one embodiment, these split rail power supply output voltages float above and below, respectively, the midpoint of the second input voltage (the power source voltage of the audio power amplifier), so that in the event of clipping by the power amplifier, the clipping is symmetrical.

Such a solution should be more power efficient than using merely low dropout regulators (LDOs), and it should also be less bulky than a magnetic or transformer-based power converter, in cases where the output power of the power supply is, for example, less than 3 Watts. This may enable the solution to fit within the stricter or smaller thermal envelope and physical internal volume of a portable consumer electronics device, such as a smartphone, a tablet computer, or a laptop computer.

An embodiment of the invention is a charge-pump based, split rail power supply circuit that can float or shift, along a second input voltage, while converting a first input voltage into a positive voltage at its top output rail and a negative voltage on its bottom output rail, relative to a new ground node (referred to here as the output ground.) In one embodiment, the voltage of the output ground moves with (stays at) the midpoint of the second input voltage, while the top and bottom rail voltages maintain a fixed separation between each other, even while the second input voltage changes during operation (e.g., the second input voltage sags and recovers due to a changing load on the second input voltage). This may be achieved using a bias voltage source that is directly connected to an intermediate node of a charge pump circuit whose outputs are the top and bottom output rails; the intermediate node is thus kept at a voltage that is between the top and bottom rail voltages of the charge pump circuit, and preferably at the midpoint of the second input voltage, even as the latter changes during operation. This helps maintain symmetrical headroom not just for a signal controller that could be powered by the top and bottom output rails but also for an audio power amplifier that could be powered directly by the second input voltage.

Another embodiment of the invention is a charge-pump based, split rail power supply circuit that produces balanced positive and negative output rail voltages, despite manufacturing variations that typically appear in the capacitances of the charge pump capacitors. For example, the charge pump capacitors may be designed to be equal in capacitance, but in practice exhibit a manufacturing process variation or tolerance, such as +/−10% in their capacitance.

Example circuit schematics of such power supply circuits are described below and shown in the drawings.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

FIG. 3 is a circuit schematic of a charge pump circuit and a bias voltage source.

FIG. 4 depicts some example digital control signals with selected phases, to operate the switches of the switch network depicted in FIG. 3.

FIG. 5 shows a configuration of the circuit of FIG. 3 when the phi switches are closed and the phi' switches are open.

FIG. 6 shows the configuration of the circuit of FIG. 3 when the phi switches are open and the phi' switches are closed.

DETAILED DESCRIPTION

Several embodiments are described with reference to the appended drawings. While numerous details are set forth, it is understood that some embodiments of the invention may be practiced without these details. In other instances, well-known circuits, structures, and techniques have not been shown in detail so as not to obscure the understanding of this description.

Figure 1:
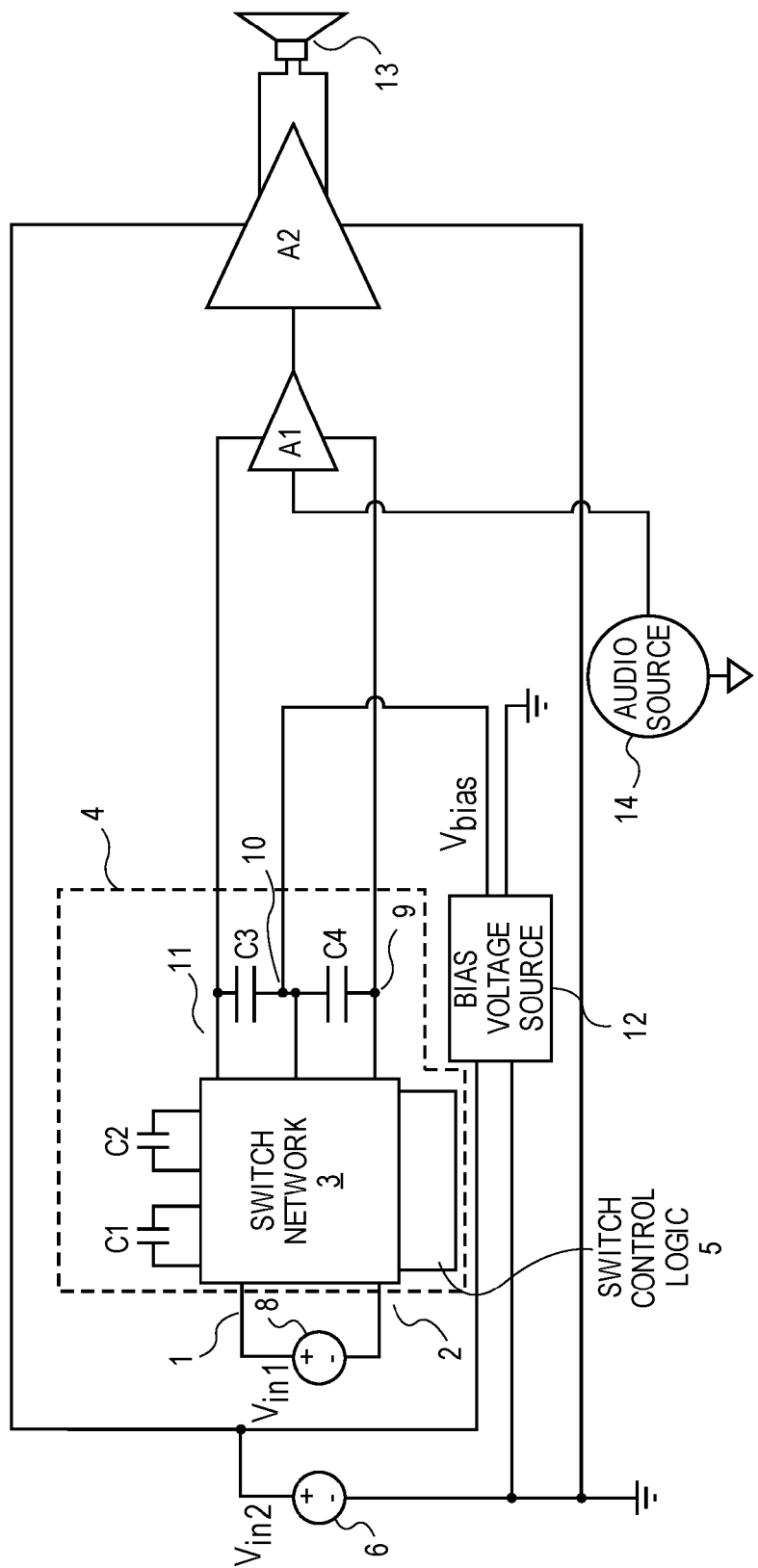
FIG. 1 is a combined block diagram and circuit schematic of a charge pump-based power supply circuit and an audio power amplifier.

FIG. 1 illustrates a charge pump-based power supply circuit in accordance with an embodiment of the invention. A charge pump circuit 4 is composed of a switch network 3 that serves to couple first and second input nodes 1, 2 to respective nodes of first and second charge pump capacitors C1, C2. The first and second input nodes 1, 2 are also shown as being coupled to a first power source 8, which produces a dc voltage Vin1. The first power source 8 may be a rechargeable battery, or a power converter that produces a regulated dc voltage (such as an ac to dc power adapter). The switch network 3 is also coupled to top and bottom output nodes 11, 9 that are respective nodes of third and fourth filter capacitors C3, C4. An intermediate node 10 is defined between the top and bottom output nodes 11, 9, where the intermediate node is shared by the capacitors C3, C4. In other words, capacitors C3, C4 are series coupled with each other at or through the intermediate node 10. To explain further, the "near plate" of C3 is directly connected (e.g., coupled by an electrical short) to the "far plate" of C4, while the "far plate" of C3 is directly connected to the top output node 11 and the "near plate" C4 is directly connected to the bottom output node 9. Said differently, the "outer plates" of C3, C4 are directly connected to the top and bottom output nodes 11, 9, respectively, while the "inner plates" of C3, C4 are coupled by an electrical short (at or through the intermediate node 10.)

The switch network 3 serves to couple the first and second capacitors C1, C2 to the third and fourth capacitors C3, C4 in accordance with charge pump action, so that it produces a voltage at the top output node 11 that is higher than a voltage of the intermediate node 10, and a voltage at the bottom output node 9 is lower than the voltage of the intermediate node 10, and where all such voltages are deemed to be dc voltages that are produced by the charge pump circuit drawing power from the first power source 8 (input voltage Vin1). To do so, the constituent switches (e.g., transistor switches) of the switch network 3 may be controlled by switch control logic circuitry 5 which produces a number of pulsed, digital control signals (e.g., periodic pulse waves, such as phi, phi' in FIG. 4, or phi1, phi2 . . . in FIG. 8) whose phases are selected to repeatedly charge and discharge C1, C2 in such a manner as to produce the desired positive and negative voltages at the top and bottom output nodes 11, 9, respectively (via a charge pump action).

In one embodiment, the capacitances of C1, C2 are designed to be equal, while the capacitances of C3, C4 may also be designed to be equal, so that the voltage of the top output node 11 is higher than the voltage of the intermediate node 10 by the same amount as the voltage of the bottom output node 9 is lower than the voltage of the intermediate node 10. This is also referred to as a balanced, dual rail power supply, for example having +5 Vdc on node 11 relative to the intermediate node 10, and −5 Vdc on node 9 also relative to the intermediate node 10. These numbers of course are just examples only; more generally the charge pump circuit may be designed to produce other balanced pairs of power supply output voltages.

Figure 2:
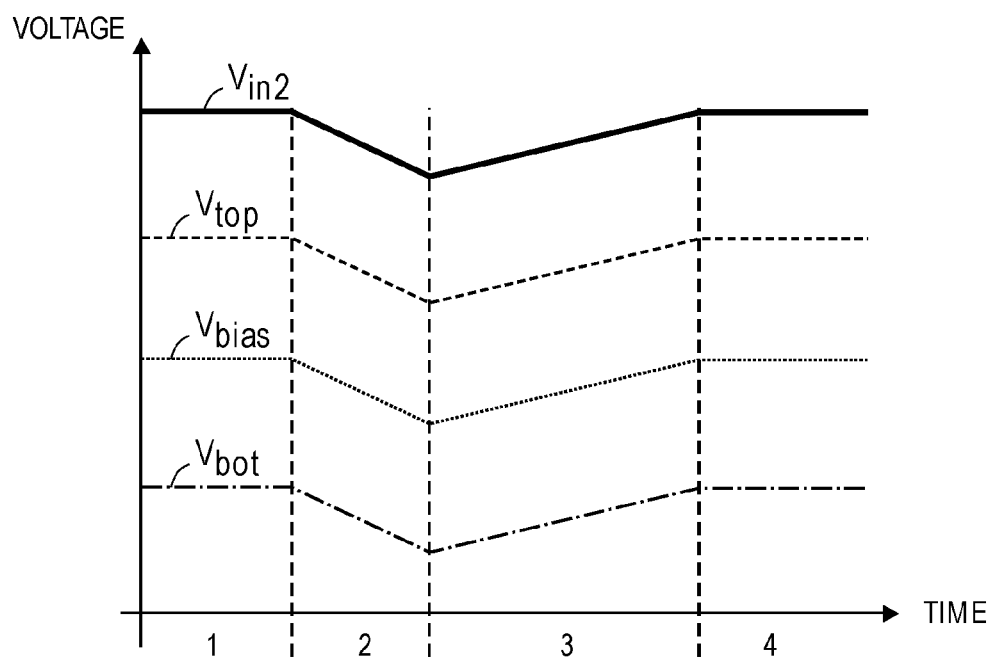
FIG. 2 is a graph of several voltage waveforms that may be exhibited by the embodiment of FIG. 1 during operation.

Still referring to FIG. 1, the charge pump-based power supply circuit also has a bias voltage source 12 having an input (a pair of nodes) that is coupled to a second power source 6. The latter has an output voltage Vin2, and supplies power to a load, here an audio power amplifier A2. In one embodiment, the second power source 6 is a power converter having voltage Vin2 that is greater than Vin1. The bias voltage source 12 has an output that is to produce and maintain an output voltage Vbias regardless of its load (hence the usage of the term bias "voltage source" 12.) The output voltage Vbias may be produced to be a predetermined proportion of the input voltage Vin2 (e.g., 50%, or, in other words, Vbias is at the midpoint between the voltages of the output nodes of the second power source 6). Vbias follows Vin2 downward (or becomes smaller) and upward (or becomes greater) as Vin2 sags and recovers, respectively, due to its changing load (the power amplifier A2). This behavior of Vbias, as being dependent upon Vin2, influences Vtop and Vbot (the voltages of the top and bottom output nodes 11, 9, respectively). An example of such behavior and influence is depicted in FIG. 2, which shows waveforms over time beginning with interval 1 in which the power source 8 is in normal operating condition (or Vin2 is at a nominal level, as are Vbias, Vbot and Vtop). Interval 1 is immediately followed by interval 2, a high energy transient interval in which the load on the power source 6 increases; such a load is depicted by an example in FIG. 1, as the audio power amplifier A2 drawing its supply current from the second power source 6 and driving a speaker 13 with elevated volume, which causes Vin2 to sag. This is immediately followed by interval 3, a recovery interval in which Vin2 recovers back to its nominal level, and then interval 4, returning to the normal operating condition. Note how, as shown in FIG. 2, Vbias follows Vin2 downward and upward, and may do so in accordance with a predetermined proportion. For example, if Vin2 starts at 40V and falls to 32V, then Vbias falls from 20V to 16V (maintaining at 50% of Vin2). As a result, Vtop (the voltage at the top output node 11) moves in accordance with the drop in Vbias, here 4 Volts, from 25V to 21V, while Vbot (the voltage at the bottom output node) also moves by the same amount, from 15V to 11V. If Vin2 then recovers to its nominal level, Vbias responds by also recovering to its nominal level, which influences Vtop and Vbot to recover their nominal levels as well (in the same manner, or in accordance with the same predetermined proportion). This is an example of how Vtop and Vbot "float" down and up, but in doing so maintain their fixed separation relative to each other.

If the nominal level of Vbias (the voltage at the intermediate node 10 during a normal operating condition of the second power source 6) is set to be at the midpoint, or 50%, of Vin2, and if Vtop and Vbot are produced in a balanced manner, that is Vtop−Vbias=|−Vbias| at all times, then symmetrical headroom is achieved for the power amplifier A2. This is also illustrated in FIG. 2, where the headroom varies over time (depending on whether Vin2 is sagging, recovering, or remains nominal), but remains symmetrical during all four time intervals of operation. In other words, the difference between Vtop and Vin remains at all times the same as the difference between Vbot and zero (the potential of the "input ground" of the second power source 6—see FIG. 1).

Referring to FIG. 1, with symmetrical headroom, any clipping of the power amplifier A2 also remains symmetrical, a desirable result. Such clipping may occur when the power amplifier A2 is receiving too large of an input signal from a signal controller A1. The signal controller A1 is driven by an audio source 14, which may be an analog or digital source of an audio signal, e.g. part of a laptop computer, a desktop computer, a tablet computer, or a smartphone. The output of the power amplifier A2 is coupled to drive a speaker 13. In such an embodiment, the sagging of Vin2 as depicted in FIG. 2 may be caused by the playback of audio through the loudspeaker 13 at elevated volume levels.

An example charge pump circuit that can produce the behavior depicted above in FIG. 2, and that has the general form shown in FIG. 1, is illustrated in circuit schematic form in FIG. 3. There, the switch network 3 is composed of two sets of switches, which are controlled by the digital control signals phi and phi'. The two phi switches serve to couple the first power source 8 through the input nodes 1, 2, to respective plates of C1, C2, and the two phi' switches serve to couple those same respective plates of C1, C2 to the output nodes 11, 9, respectively. Respective plates of the capacitors C3, C4 are coupled to the output nodes 11, 9, such that C3, C4 may serve to filter the voltages on the output nodes 11, 9 relative to the intermediate node 10 which is shared by C3, C4 as shown. A third phi' switch is shown that when closed directly connects a shared node of C1, C2 to the intermediate node 10.

The digital control signals phi and phi' may be as depicted in FIG. 4, e.g., square waves that are essentially 180 degrees out of phase with each other (with the understanding that in practice the phases of such signals may be non-overlapping in that their adjacent clock edges are slightly shifted, to avoid unwanted cross conduction effects.) To achieve a balanced output of Vbias+½ Vin1 and Vbias−½ Vin1 at the top and bottom output nodes 11, 9, respectively, —see FIG. 1, the capacitances of C1 and C2 may be designed to be equal, while the capacitances of C3 and C4 should also be designed to be equal. The capacitors C3, C4 may serve to filter the output voltages, while the capacitors C1, C2 may also be referred to as charge pump capacitors or flying capacitors. The capacitance values should be selected in view of the desired power output of the charge pump power supply circuit, that is the power delivered to a load that includes the signal controller A1, from the output nodes 11, 9—see FIG. 1. In one embodiment, this output power is less than 3 Watts.

Operation of the switch network 3 as part of the charge pump power supply circuit depicted in FIG. 3 may be illustrated using FIG. 5 and FIG. 6. The charge pump circuit exhibits a repeating charge pump cycle that repeats in accordance with the repetitive or periodic waveforms of the digital control signals phi and phi' such as those depicted in FIG. 4. FIG. 5 illustrates a first phase of the cycle in which the switches that are controlled by the digital control signal phi are closed, while the switches that are controlled by the digital control signal phi' are open, resulting in the capacitors C1 and C2 being charged while connected in series with the first power supply 8 (Vin1). This results in one of half of Vin1 being dropped across each of C1, C2 (assuming that the capacitances of C1 and C2 are designed to be equal). Next, the first phase may be "immediately" followed by the second phase of the charge pump cycle, where here the use of that term is with the understanding above that it may include a slight delay to ensure no overlap between the first and second phases); the resulting configuration of the charge pump circuit is depicted in FIG. 6. In the second phase, the switches that are controlled by phi are now open, while the switches that are controlled by phi' are closed, which results in the transfer of charge from C1, C2 to C3, C4. In so doing however, the presence of the voltage bias source 12 forces the intermediate node 10 that is shared by the capacitors C3, C4, to Vbias, such that the charge transfer results in the top output node 11 rising to Vbias+½ Vin1 while the bottom output node 9 (which is balanced in with the top output node) falls to Vbias−½ Vin1. This results in positive and negative output rail voltages on nodes 11, 9, respectively, relative to the output ground on the intermediate node 10. The phases in FIG. 5 and FIG. 6 repeat in each charge pump cycle, thereby producing those unregulated but balanced positive and negative voltages on the top node 11 and bottom node 9 relative to the intermediate node 10—see FIG. 1.

In this manner, taking the example given above in the Summary section, if Vin2=40 Vdc, then the charge pump circuit output rails may be at 25 Vdc and 15 Vdc, a separation of 10 Volts centered at Vbias=20 Vdc. Now, if Vin2 sags from 40 Vdc to 35 Vdc, then Vbias, being set or predetermined to be 50% of Vin2, responds by dropping to 17.5 Vdc. As a result, the charge pump circuit drops the top rail to 22.5 Vdc and drops the bottom rail to 12.5 Vdc, which maintains the separation between the top and bottom output rails at 10 Volts centered at the output ground which is at Vbias=17.5 Vdc. The output ground responds to and follows the sagging Vin2, so that the difference between the top output rail and Vin2 and the difference between bottom output rail and zero volts (the ground of the first power source 8) remains the same. As a result, signal headroom remains consistent and any clipping by the power amplifier A2—see FIG. 1—remains symmetrical.

Operation of the charge pump based power supply circuit described above in connection with FIG. 1 is an example of a more general method or process for electrical power conversion, where power is drawn from the first and second input nodes 1, 2 (first input voltage) to produce i) a voltage at the top output node 11 that is higher than a voltage of the intermediate node 10, and ii) a voltage at the bottom output node 9 that is lower than the voltage of the intermediate node 10. In such a process, the voltage of the intermediate node 10 is controlled, independently of the voltages at the top and bottom output nodes 11, 9, so that the voltage of the intermediate node 10 i) is a predetermined proportion of a second input voltage and ii) follows the second input voltage downward and upward as the second input voltage sags and recovers, respectively. For example, the voltage of the intermediate node 10 may be controlled to always follow the second input voltage in accordance with the predetermined proportion. The voltage of the intermediate node 10 may be controlled to always be at the midpoint of the second input voltage. Lastly, drawing power from the first and second input nodes 1, 2 to produce the voltages at the top and bottom output nodes 11, 9 may be accomplished by controlling the switch network 3 of a charge pump circuit such as the one depicted in FIG. 3, or the one depicted in FIG. 7 described next.

Figure 7:
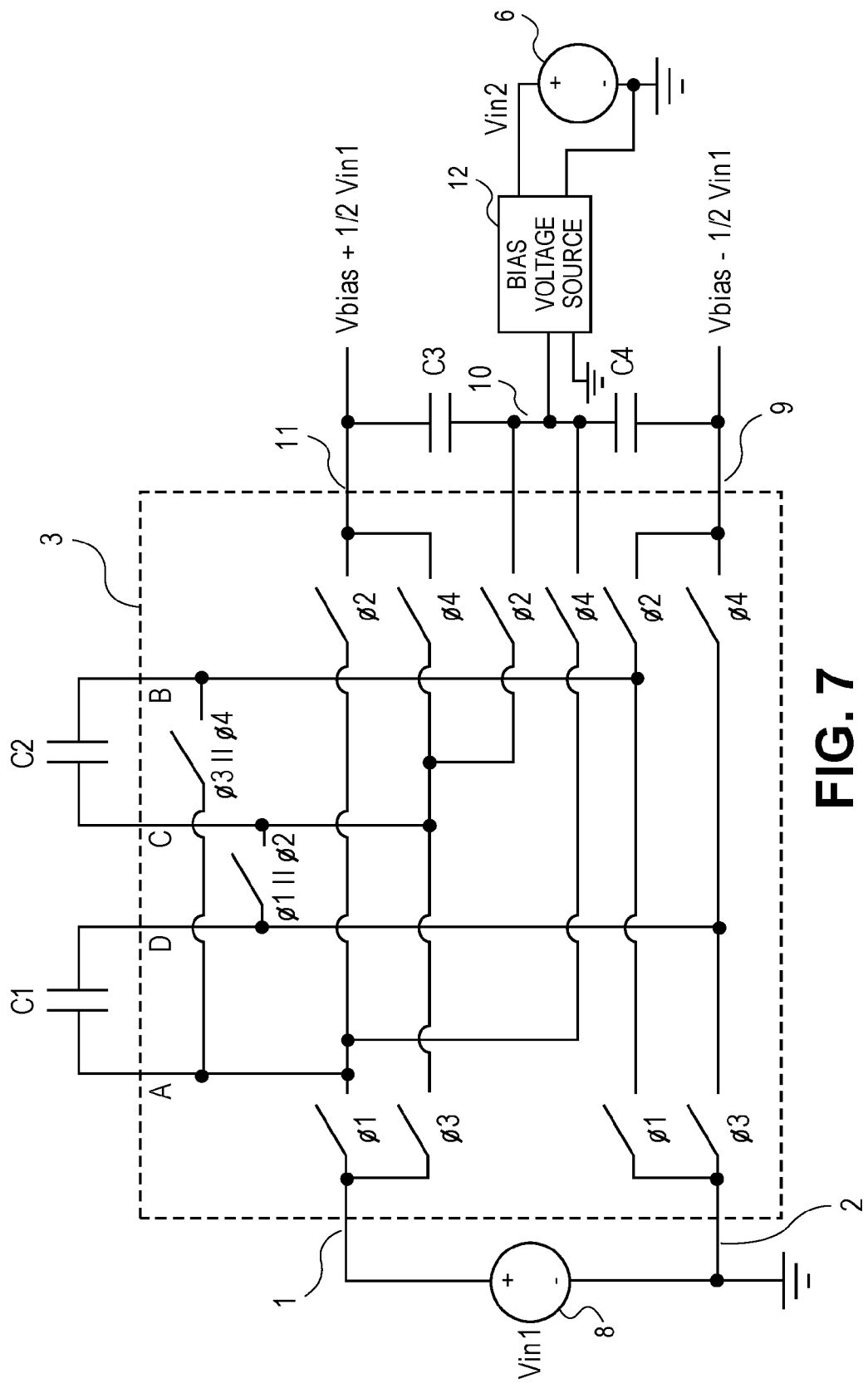
FIG. 7 is a circuit schematic of another charge pump circuit that may generate more balanced output rail voltages than the embodiment of FIG. 3.
Figure 8:
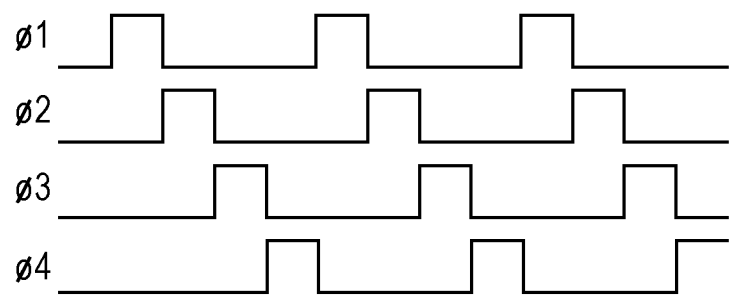
FIG. 8 depicts some digital control signals having selected phases, to operate the switches of the switch network of the charge pump circuit in FIG. 7.

Turning now to FIG. 7, a circuit schematic of a charge pump circuit that may generate output rail voltages that are more balanced (relative to each other) than the embodiment of FIG. 3 is shown. FIG. 8 depicts some digital control signals having selected relative phases, to operate the switches of the switch network 3 of the charge pump circuit of FIG. 7. In this embodiment, the switch network 3 is designed to enable a balanced charging and discharging of the capacitors C1, C2, so that the voltages produced on the top and bottom output rails. These output rails may be the output nodes 11, 9, which are directly connected to the "outer" plates of the capacitors C3, C4, respectively, while the "inner" plates of the C3, C4 share the intermediate node 10. The output rail voltage are more balanced, e.g., are more immune to the practical variation between the capacitances of C1, C2 which otherwise may be specified as being equal, or closer to being exactly equal to each other in absolute value (and opposite in polarity relative to the intermediate node 10). In the example of FIG. 7 and FIG. 8, the charge pump cycle is divided into four phases, and operation of the charge pump circuit is controlled by the four digital control signals phi1, phi2, phi3, and phi4 depicted in FIG. 8. These control signals are pulse waves that have the same period (a complete charge pump cycle) and the same pulse width, but different phases; phi2 is delayed a quarter cycle relative to phi1, phi3 is delayed a quarter cycle relative to phi2, and phi 4 is delayed a quarter cycle relative to phi3. These control signals are applied to control the closed/open states of the switches shown in FIG. 7, where in this example a switch is closed when its control signal is asserted, and open when the control signal is deasserted. Here too, and as mentioned above with respect to the embodiment of FIG. 3, the phases of such control signals may be non-overlapping in that adjacent clock edges are slightly shifted, to avoid unwanted cross conduction effects. Note that in this particular example, one of the switches is controlled by a logical OR of phi1 and phi2, while another is controlled by the logical OR of phi3 and phi4. It should be noted that the switch network 3 may be implemented using other switch arrangements (and their associated digital control signals.)

Control of the switch network 3 that is depicted in FIG. 7, by the digital control signals of FIG. 8, may be explained with the help of the circuit schematics in FIGS. 9-12. These four figures show the current paths (in bold or thick lines) that are formed by the switches of the switch network 3, during each of the four phases of the charge pump cycle, respectively, for purposes of charging or discharging of the charge pump capacitors C1, C2.

Figure 9:
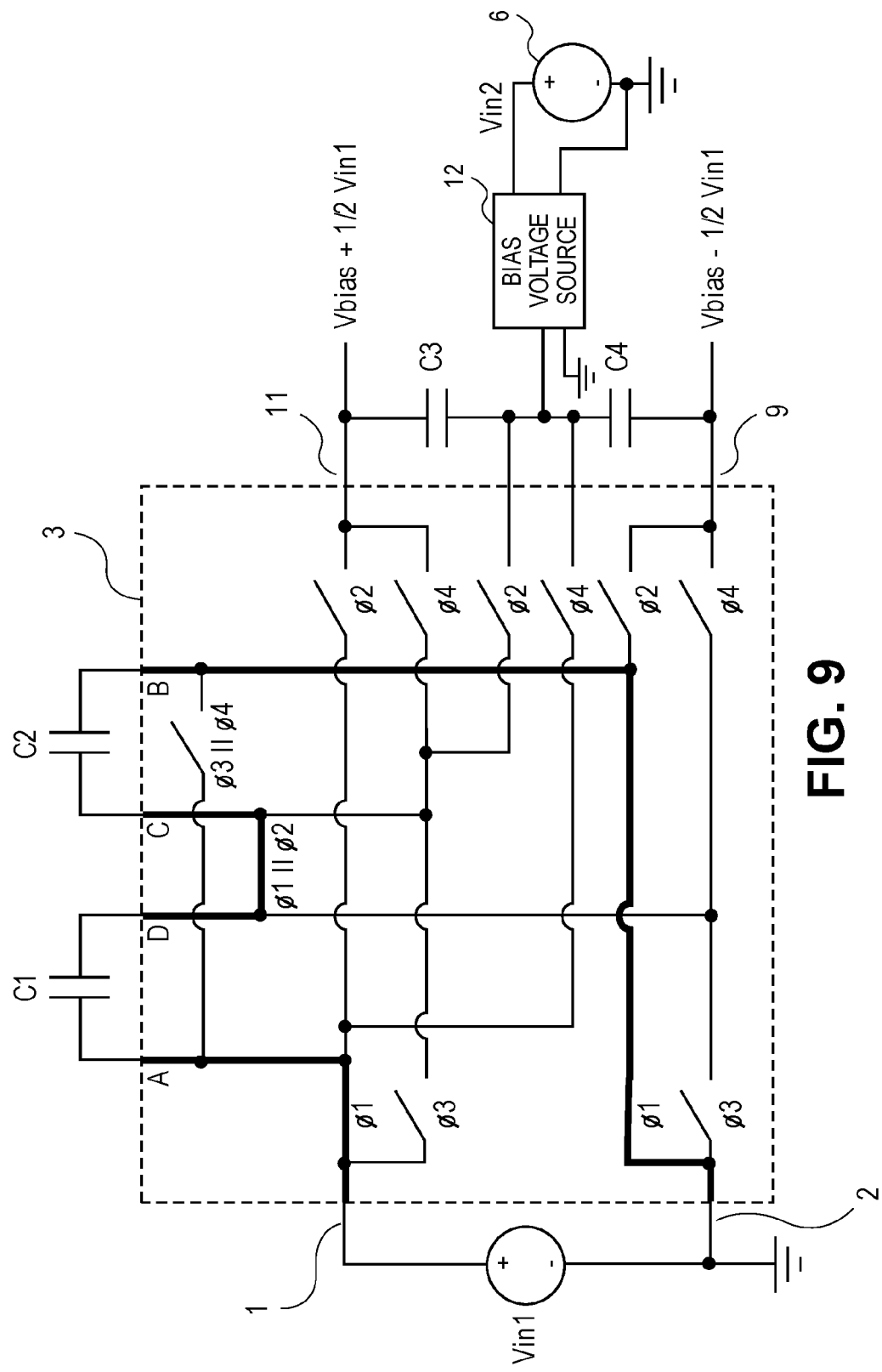
FIG. 9 shows a first phase of a charge pump cycle in which the charge pump capacitors are being charged in series.

FIG. 9 illustrates a first phase of the charge pump cycle in which the switches that are controlled by the digital control signal phi1 (including its logical OR) are closed, while all other switches are open, resulting in the capacitors C1 and C2 being charged through the current path indicated in bold, while connected in series with the first power source 8 (Vin1.) It is instructive to note here that the first capacitor C1 is charged at high side while the second capacitor C2 is charge at low side, e.g., the physical order of the series connection of C1 and C2 is such that the input node 1 (high side of the first power source 8, Vin1) is directly connected to C1, and not C2. This results in one of half of Vin1 being dropped across each of C1, C2 (assuming that the capacitances of C1 and C2 are designed to be equal).

Figure 10:
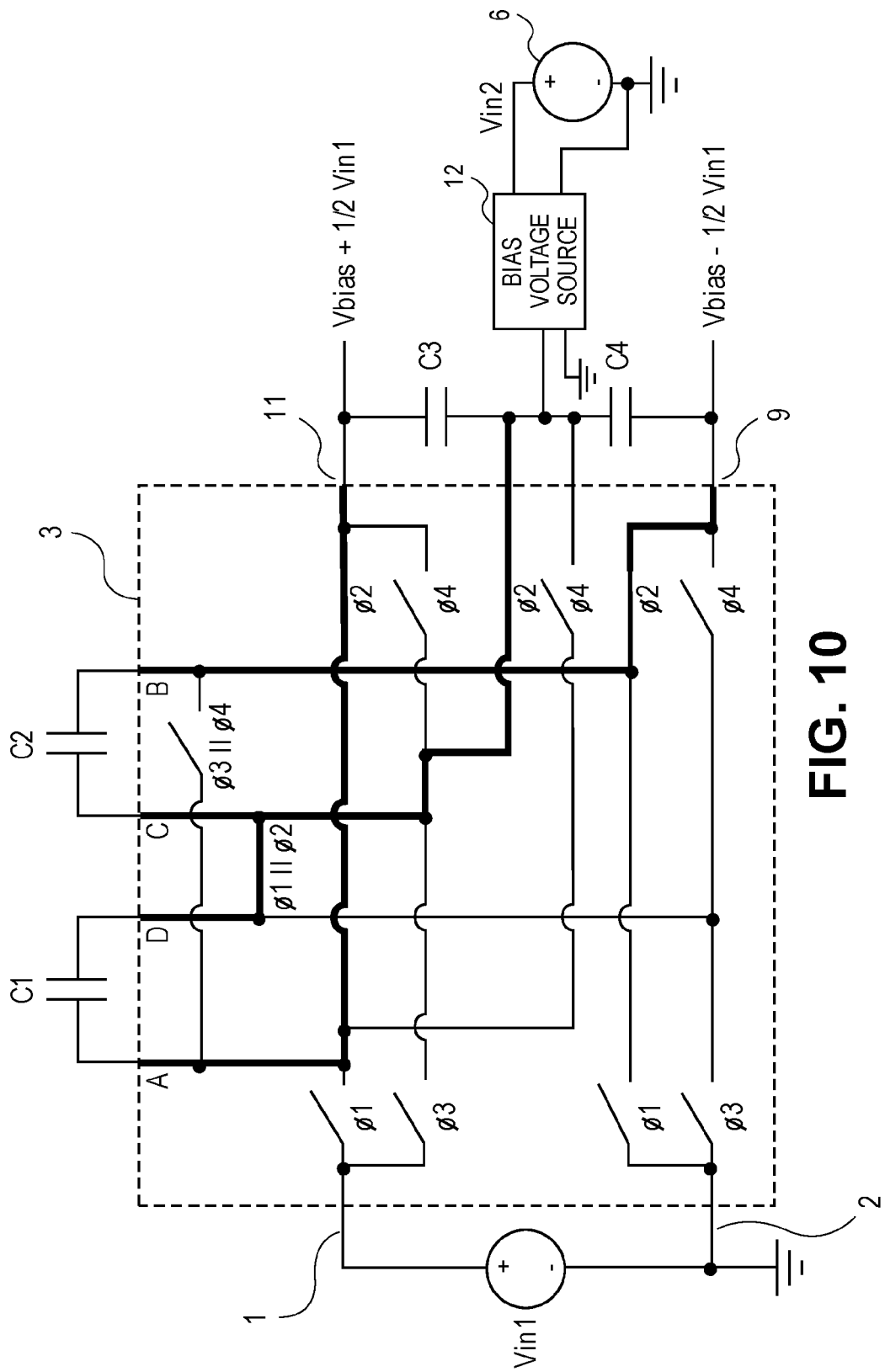
FIG. 10 shows a second phase of the charge pump cycle, in which the capacitors are being discharged in series.

Next, the first phase may be "immediately" followed by the second phase of the charge pump cycle, with the understanding given above that there may be a slight delay to ensure no overlap between the first and second phases; this results in the configuration depicted in FIG. 10. This discharge phase may be explained as follows. Here, C1 and C2, while still coupled in series as in FIG. 9, are now discharged into C3, C4, respectively, through the current path shown in bold which is produced by those switches that are controlled by phi2 (including its logical OR) being closed. Note here that the charge is transferred from C1 at high side and C2 at low side, to C3, C4 (which are coupled in series.)

Figure 11:
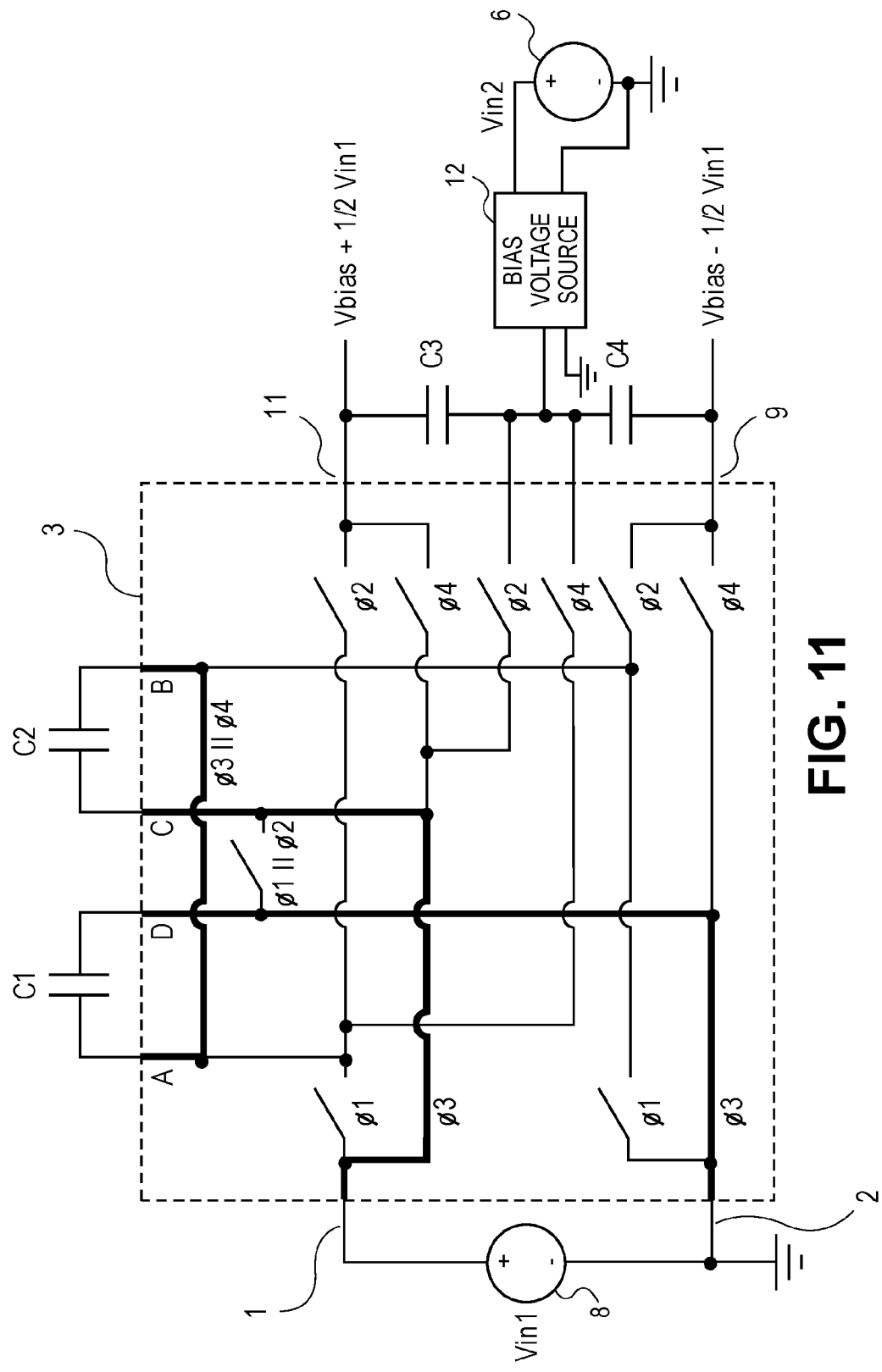
FIG. 11 shows a third phase of the charge pump cycle in which the capacitors are being charged in series while reversed in order as compared to FIG. 9.
Figure 12:
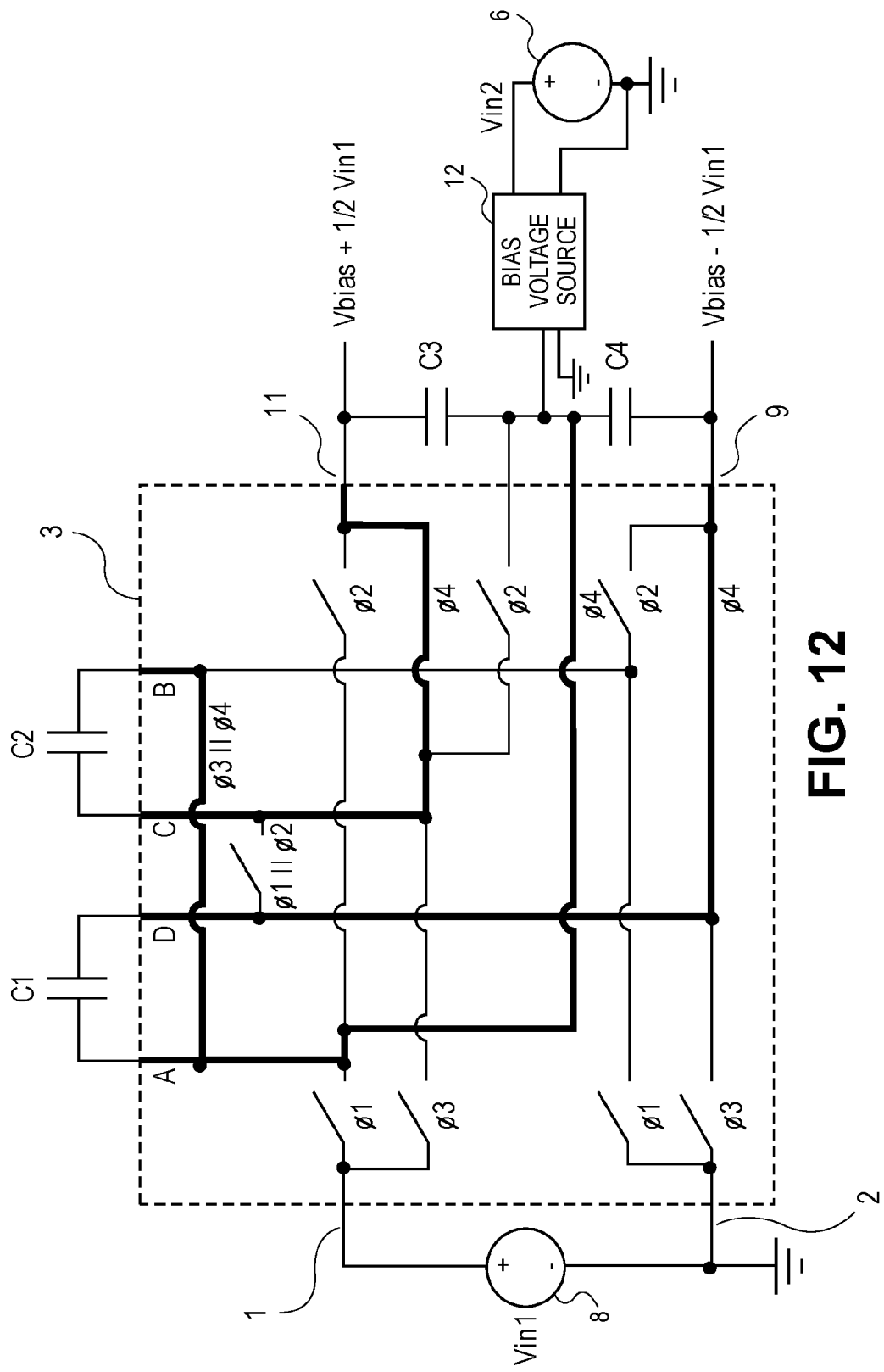
FIG. 12 shows a fourth phase of the charge pump cycle in which the capacitors are being discharged in series while reversed in order as compared to FIG. 10.

Next, the second phase may be immediately followed by the third phase of the charge pump cycle, which is depicted in FIG. 11. Here, once again C1 and C2 are charged in series except that now C2 is charged at high side while C1 is charged at low side (the reverse order of phase 1). The third phase is then immediately followed by the fourth phase depicted in FIG. 12. This discharge phase may be explained as follows. Here, C1, C2 are again discharged, but this time the charge is transferred from C2 at high side and C1 at low side, to C3, C4, respectively. The reversal of the series connection of C1, C2 during the charge and discharge phases, just described in connection with FIGS. 9-12, may result in the voltages on the output nodes 11, 9 being balanced, e.g., more immune to a difference between the capacitances of C1 and C2.

Figure 13:
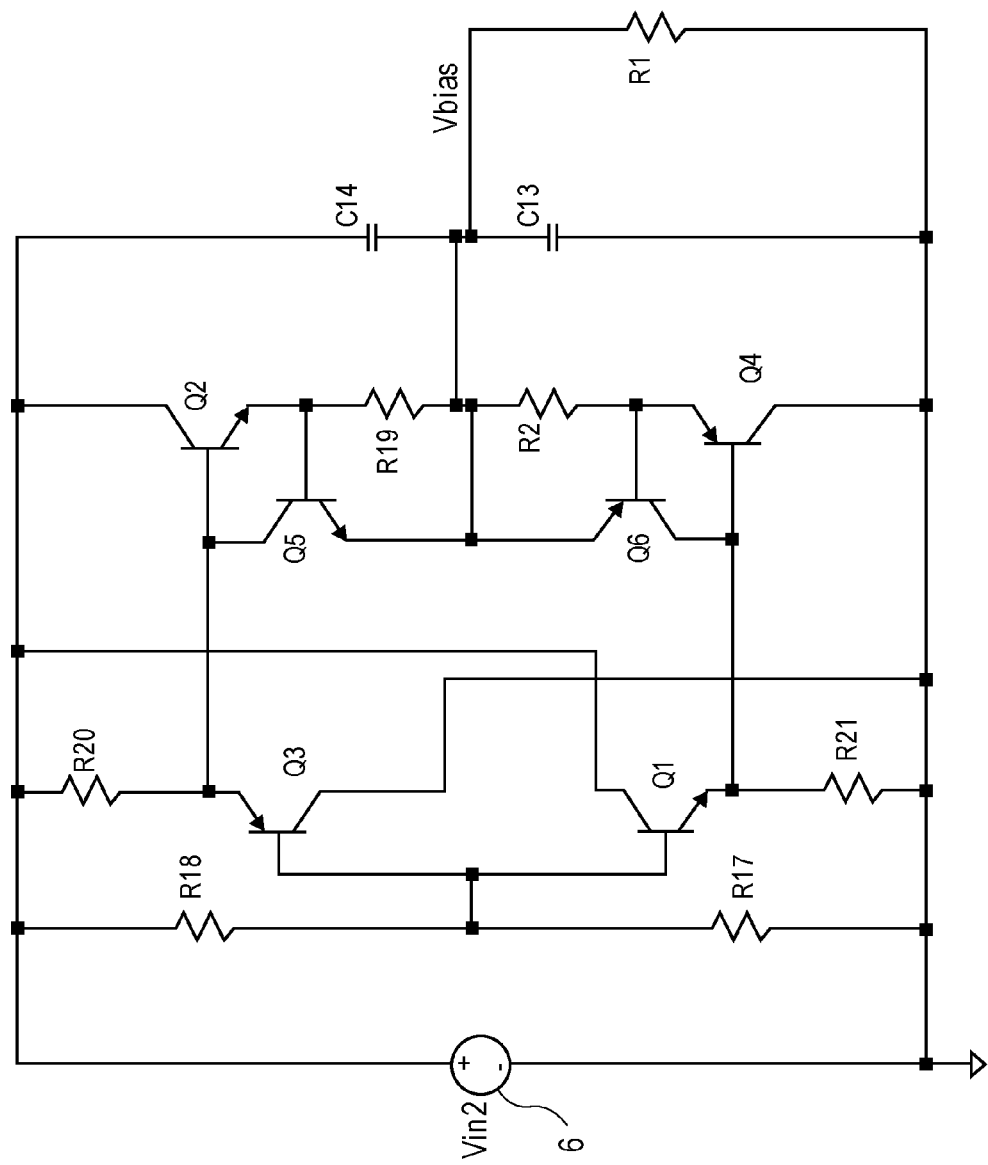
FIG. 13 is a circuit schematic of an example voltage bias source.

Referring now to FIG. 13, this is a circuit schematic of an example of the bias voltage source 12. As mentioned above, the bias voltage source 12 should produce a voltage Vbias at its output node that is independent of the resistance of R1 (which may represent the load on the output node), but that does depend on the voltage Vin2 at its input node. In particular, the circuit in FIG. 13 may achieve this goal by being an "active voltage divider" that is designed so that Vbias is at all times, in this case, 50% of Vin2, staying at 50% of Vin2 as Vin2 sags and recovers. To achieve the 50% fraction, the resistance values of the voltage divider R18 and R17 are designed to be equal. Those of R20 and R21 may also be designed to be equal, as well as those of R19 and R2, to provide a balanced operation, when Vin2 drops as well as when Vin2 rises. The resistors R20, R21, R19 and R2 are part of a unity gain voltage buffer amplifier circuit, implemented using bipolar junction transistors Q1-Q6, which buffers the divided voltage at the shared node of R18 and R17, to yield the output voltage Vbias that is equal to the divided voltage (but with lower output impedance). The capacitors C14, C13 are coupled to share the output node, and serve to filter the output voltage Vbias. Note that a voltage divider followed with a voltage buffer amplifier may alternatively be implemented using field effect transistors.

An embodiment of the invention is a charge-pump circuit having the switch network 3, and the switch control logic 5. The switch network 3 has first and second input nodes 1, 2 to be coupled to the first power source 8 (Vin1), a first capacitor node to be coupled to a plate of the first capacitor C1, a second capacitor node to be coupled to a plate of the second capacitor C2, a first output node 11 to be coupled to a plate of the third capacitor C3, and a second output node 9 to be coupled to a plate of the fourth capacitor C4. The switch control logic is to produce two or more digital control signals that control the switch network 5, wherein phases of the digital control signals are such that C1 and C2 become charged by the power source 8 and then discharged in each charge pump cycle. The charge pump cycles thus produce effectively a dc voltage at the first output node 11 that is higher than the dc voltage of an intermediate node 10 which is shared by the third and fourth capacitors C3, C4, by the same amount as a dc voltage produced at the second output node 9 is lower than the voltage of the intermediate node 10. The addition of the bias voltage source 12 enables the output node voltages to "float" and follow any sagging and recovery by the second power source 6 (Vin2), thereby contributing to symmetric headroom for an amplifier that is being supplied by the second power source 6 and whose signal controller is being supplied by the output nodes 11, 9.

Another embodiment of the invention is a charge-pump circuit that can be used to produce more balanced, dual polarity output rails (from a single polarity power source). Referring to FIGS. 7-12, the first and second input nodes 1, 2 are to be coupled to the first power source 8. There are first, second, third, and fourth capacitor nodes A, B, C, D, which may be coupled to the first and second capacitors C1, C2 as shown. There are also the first and second output nodes 11, 9. The switch network 3 couples the first and second input nodes to the capacitor nodes A, B, C, D, so as to charge the first and second capacitors C1, C2; it also couples the capacitor nodes A, B, C, D to the first and second output nodes so as to discharge the first and second capacitors C1, C2, all under control of the switch control logic 5, so that a) during a first phase of a charge pump cycle, the node A is coupled to the first input node 1 while the node B is coupled to the second input node 2, b) during a second phase of the charge pump cycle, the node A is coupled to the first output node 11 while the node B is coupled to the second output node 9, c) during a third phase of the charge pump cycle, the node C is coupled to the first input node 1 while the node D is coupled to the second input node 2, and d) during a fourth phase of the charge pump cycle, the node C is coupled to the first output node 11, while the node D is coupled to the second output node 9.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, the charge pump based power supply circuits described above can be used to supply power to a variety of different loads. FIG. 1 shows one example application where the benefits of balanced output rails and symmetric headroom are apparent, e.g., the signal controller A1 having positive and negative power supply inputs that are coupled to be powered by the top and bottom output nodes 11, 9 of the charge pump circuit, and where the signal controller A1 is driving the power stage transistors (not shown) of the audio power amplifier A2. The latter has upper and lower power supply inputs that are coupled to be powered by the second power source 6 as shown. Other load applications are possible. Also, while FIG. 1 shows a direct connection between the output rails of the charge pump circuit (nodes 11, 9) and the power supply input nodes of the signal controller A1, in another instance a low drop out regulator may be added between the output rail and the input node (of the signal controller A1), if a smaller power supply voltage is needed by the controller A1. The description is thus to be regarded as illustrative instead of limiting.

The invention claimed is:

1. A charge-pump based power supply circuit, comprising:
   a charge pump circuit having first and second input nodes to receive a first input voltage, and top and bottom output nodes and an intermediate node,
   wherein the charge pump circuit is to produce i) a voltage at the top output node that is higher than a voltage of the intermediate node, and ii) a voltage at the bottom output node that is lower than the voltage of the intermediate node; and
   a bias voltage source having i) first and second input nodes to receive a second input voltage being a power supply voltage, and ii) an output that is to produce an output voltage, which is a predetermined proportion of the second input voltage and that follows the second input voltage downward and upward as the second input voltage sags and recovers, respectively,
   and wherein the output of the bias voltage source is directly connected to the intermediate node.

2. The power supply circuit of claim 1 wherein the output voltage of the bias voltage source is to follow the second input voltage in accordance with the predetermined proportion.

3. The power supply circuit of claim 1 wherein the bias voltage source is to maintain its output voltage at a midpoint between the voltages of its first and second input nodes.

4. The power supply circuit of claim 1 wherein the charge pump circuit comprises:
   first and second capacitors;
   a switch network that couples the first and second input nodes to respective nodes of the first and second capacitors; and
   third and fourth capacitors that are coupled to each other through a shared node being the intermediate node, wherein the top and bottom output nodes are respective nodes of the third and fourth capacitors, and
   wherein the switch network couples the first and second capacitors to the third and fourth capacitors.

5. The power supply circuit of claim 4 wherein the switch network is controlled by a plurality of digital control signals whose relative phases are such that the voltage at the top output node is higher than the voltage of the intermediate node by the same amount as the voltage at the bottom output node is lower than the voltage of the intermediate node.

6. The power supply circuit of claim 5 wherein the switch network is controlled by the digital control signals in such a way that
   a) during a first phase of a charge pump cycle, the first capacitor is charged at high side while the second capacitor is charge at low side,
   b) during a second phase of the charge pump cycle, charge is transferred from the first capacitor at high side and the second capacitor at low side, to the third and fourth capacitors, respectively,
   c) during a third phase of the charge pump cycle, the second capacitor is charged at high side while the first capacitor is charged at low side, and
   d) during a fourth phase of the charge pump cycle, charge is transferred from the second capacitor at high side and the first capacitor at low side, to the third and fourth capacitors, respectively.

7. The charge-pump based power supply circuit of claim 1 in combination with:
   a signal controller having positive and negative power supply inputs that are coupled to be powered by the top and bottom output nodes of the charge pump circuit; and
   an audio power amplifier having upper and lower power supply inputs that are to receive the second input voltage, wherein the second input voltage is greater than the first input voltage.

8. A method for electrical power conversion, comprising:
   drawing power from first and second input nodes having a first input voltage, to produce i) a voltage at a top output node that is higher than a voltage of an intermediate node, and ii) a voltage at a bottom output node that is lower than the voltage of the intermediate node; and
   controlling the voltage of the intermediate node, independently of the voltages at the top and bottom output nodes, so that the voltage of the intermediate node i) is a predetermined proportion of a second input voltage being a power supply voltage, and ii) follows the second input voltage downward and upward as the second input voltage sags and recovers, respectively.

9. The method of claim 8 wherein drawing power from the first and second input nodes to produce the voltages at the top and bottom output nodes comprises controlling a switch network of a charge pump circuit.

10. The method of claim 9 wherein the voltage of the intermediate node is controlled to follow the second input voltage in accordance with the predetermined proportion.

11. The method of claim 8 wherein the voltage of the intermediate node is controlled to follow the second input voltage in accordance with the predetermined proportion.

12. The method of claim 8 wherein the voltage of the intermediate node is controlled to be at a midpoint between the voltages of first and second nodes across which the second input voltage appears.

13. A charge-pump circuit comprising:
   a switch network having
      first and second input nodes to receive a first input voltage,
      a first capacitor node to be coupled to a first capacitor,
      a second capacitor node to be coupled to a second capacitor, and
      first and second output nodes;
   switch control logic that is to produce a plurality of digital control signals to control the switch network, wherein phases of the digital control signals are such that the voltage at the first output node is higher than the voltage of an intermediate node that is shared by series coupled third and fourth capacitors, by the same amount as the voltage at the second output node is lower than the voltage of the intermediate node; and
   a bias voltage source having i) first and second input nodes to receive a second input voltage being a power supply voltage, and ii) an output that is to produce an output voltage which is a predetermined proportion of the second input voltage and that is to follow the second input voltage downward and upward as the second input voltage sags and recovers, respectively,
   and wherein the output of the bias voltage source is directly connected to the intermediate node.

14. The charge-pump circuit of claim 13 wherein the output voltage of the bias voltage source is to follow the second input voltage in accordance with the predetermined proportion.

15. The charge-pump circuit of claim 13 wherein the bias voltage source is to maintain its output voltage at a midpoint between the voltages of its first and second input nodes.

16. A charge-pump circuit, comprising:
   first and second input nodes to receive a first input voltage,
   first, second, third, and fourth capacitor nodes to be coupled to first and second capacitors;
   first and second output nodes that are to be coupled to third and fourth capacitors, respectively, and a shared node that is to be coupled to both of the third and fourth capacitors;
   switch control logic; and
   a switch network that couples the first and second input nodes to the capacitor nodes so as to charge the first and second capacitors, and couples the capacitor nodes to the first and second output nodes so as to discharge the first and second capacitors, under control of the switch control logic so that
      a) during a first phase of a charge pump cycle, the first capacitor node is coupled to the first input node while the second capacitor node is coupled to the second input node,
      b) during a second phase of the charge pump cycle, the first capacitor node is coupled to the first output node while the second capacitor node is coupled to the second output node and the third capacitor node is coupled to the shared node,
      c) during a third phase of the charge pump cycle, the third capacitor node is coupled to the first input node while the fourth capacitor node is coupled to the second input node, and
      d) during a fourth phase of the charge pump cycle, the third capacitor node is coupled to the first output node while the fourth capacitor node is coupled to the second output node and the first capacitor node is coupled to the shared node.

17. The charge-pump circuit of claim 16 further comprising
   a bias voltage source having i) first and second input nodes to receive a second input voltage and ii) an output that is to produce an output voltage, which is a predetermined proportion of the second input voltage and that is to follow the second input voltage downward and upward as the second input voltage sags and recovers, respectively,
   and wherein the output of the bias voltage source is directly connected to the shared node that is shared by the third and fourth capacitors which are to be coupled to the first and second output nodes, respectively.

18. The charge-pump circuit of claim 17 wherein the output voltage of the bias voltage source follows its input voltage in accordance with the predetermined proportion.

19. The charge-pump circuit of claim 17 wherein the bias voltage source is to maintain its output voltage at a midpoint between the voltages of its first and second input nodes.

20. The charge-pump circuit of claim 16 in combination with:
- an audio signal amplifier having positive and negative power supply inputs that are coupled to be powered by respective nodes of the third and fourth capacitors of the charge pump circuit; and
- an audio power amplifier having upper and lower power supply inputs that are to receive the second input voltage, wherein the second input voltage is greater than the first input voltage.

* * * * *